(12) United States Patent
Takahashi et al.

(10) Patent No.: US 8,207,531 B2
(45) Date of Patent: Jun. 26, 2012

(54) THIN FILM TRANSISTOR, DISPLAY DEVICE USING THIN FILM TRANSISTOR, AND PRODUCTION METHOD OF THIN FILM TRANSISTOR

(75) Inventors: Kenji Takahashi, Yokohama (JP); Ryo Hayashi, Yokohama (JP); Seiichiro Yaginuma, Kodaira (JP)

(73) Assignee: Canon Kabushiki Kaisha, Tokyo (JP)

( * ) Notice: Subject to any disclaimer, the term of this patent is extended or adjusted under 35 U.S.C. 154(b) by 66 days.

(21) Appl. No.: 12/858,605

(22) Filed: Aug. 18, 2010

(65) Prior Publication Data

US 2011/0049509 A1 Mar. 3, 2011

(30) Foreign Application Priority Data

Aug. 25, 2009 (JP) .................... 2009-194134
Jun. 11, 2010 (JP) .................... 2010-134341

(51) Int. Cl.
*H01L 29/22* (2006.01)
(52) U.S. Cl. ............ 257/43; 257/59; 257/66; 257/70; 257/76; 257/E29.095; 257/E21.411
(58) Field of Classification Search .......... 257/43, 257/59, 66, 70, 76, E29.095, E21.411
See application file for complete search history.

(56) References Cited

U.S. PATENT DOCUMENTS

| 7,411,209 | B2 | 8/2008 | Endo et al. ................ 257/43 |
| 2007/0090365 | A1 | 4/2007 | Hayashi et al. ............ 257/72 |
| 2009/0072232 | A1 | 3/2009 | Hayashi et al. ............ 257/43 |
| 2010/0044703 | A1 | 2/2010 | Yabuta et al. ............. 257/43 |
| 2010/0053041 | A1 | 3/2010 | Abe et al. ................ 345/76 |
| 2010/0059751 | A1 | 3/2010 | Takahashi et al. ......... 257/57 |
| 2010/0085081 | A1 | 4/2010 | Ofuji et al. .............. 326/102 |
| 2010/0117072 | A1 | 5/2010 | Ofuji et al. .............. 257/43 |
| 2010/0194450 | A1 | 8/2010 | Shimizu et al. ............ 327/109 |
| 2010/0203673 | A1 | 8/2010 | Hayashi et al. ............ 438/104 |
| 2010/0244022 | A1 | 9/2010 | Takahashi et al. .......... 257/43 |

FOREIGN PATENT DOCUMENTS

| JP | 2002-076356 A | 3/2002 |
| JP | 2002-196362 A | 7/2002 |
| JP | 2004-170656 A | 6/2004 |
| JP | 2008-117863 A | 5/2008 |
| WO | WO 02/01603 A2 | 1/2002 |

OTHER PUBLICATIONS

K. Nomura et al., "Room-temperature fabrication of transparent flexible thin-film transistors using amorphous oxide semiconductors," Nature, vol. 432, pp. 488-492 (Nov. 25, 2004). C. van Berkel et al., "Photo-field effect in amorphous silicon thin-film transistors," Journal of Applied Physics, vol. 60, No. 4, pp. 1521-1527 (Aug. 15, 1986).
D.P. Gosain et al., "Instability of Amorphous IGZO TFTs under Light Illumination," Proceedings of the Fifteenth International Workshop on Active-Matrix Flatpanel Displays and Devices (Tokyo, Japan), AM-FPD2008, pp. 291-294 (Jul. 2-4, 2008).

*Primary Examiner* — Long Pham
(74) *Attorney, Agent, or Firm* — Fitzpatrick, Cella, Harper & Scinto

(57) ABSTRACT

Provided is a thin film transistor including: a first gate electrode; a first gate insulating layer covering the first gate electrode; a semiconductor layer on the first gate insulating layer; a second gate insulating layer on the semiconductor layer; a second gate electrode on the second gate insulating layer; and a drain electrode and a source electrode electrically connected to the semiconductor layer, in which: the semiconductor layer is an amorphous oxide semiconductor containing at least one of Zn, Ga, In, and Sn; the first gate electrode shields light entering the semiconductor layer from below, and the second gate electrode shields light entering the semiconductor layer from above; and the second gate electrode is electrically connected to the first gate electrode by penetrating the first gate insulating layer and the second gate insulating layer, to thereby shield light entering the semiconductor layer from at least one of sides thereof.

7 Claims, 14 Drawing Sheets

CROSS-SECTION PERPENDICULAR TO CHANNEL LENGTH DIRECTION

CROSS-SECTION PERPENDICULAR TO CHANNEL WIDTH DIRECTION

CROSS-SECTION PERPENDICULAR TO CHANNEL LENGTH DIRECTION

CROSS-SECTION PERPENDICULAR TO CHANNEL WIDTH DIRECTION

CROSS-SECTION PERPENDICULAR TO CHANNEL LENGTH DIRECTION

CROSS-SECTION PERPENDICULAR TO CHANNEL WIDTH DIRECTION

CROSS-SECTION PERPENDICULAR
TO CHANNEL LENGTH DIRECTION

CROSS-SECTION PERPENDICULAR
TO CHANNEL WIDTH DIRECTION

CROSS-SECTION PERPENDICULAR
TO CHANNEL LENGTH DIRECTION

CROSS-SECTION PERPENDICULAR
TO CHANNEL WIDTH DIRECTION

CROSS-SECTION PERPENDICULAR
TO CHANNEL LENGTH DIRECTION

CROSS-SECTION PERPENDICULAR
TO CHANNEL WIDTH DIRECTION

FIG. 10A

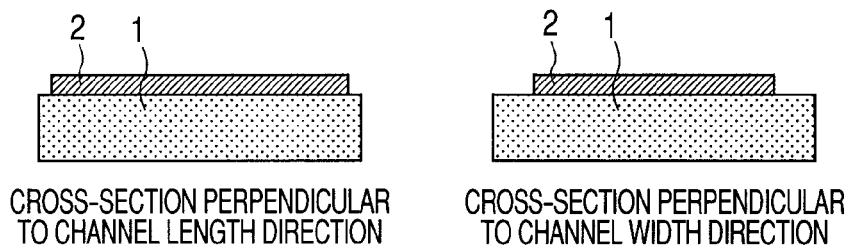

CROSS-SECTION PERPENDICULAR
TO CHANNEL LENGTH DIRECTION

CROSS-SECTION PERPENDICULAR
TO CHANNEL WIDTH DIRECTION

FIG. 10B

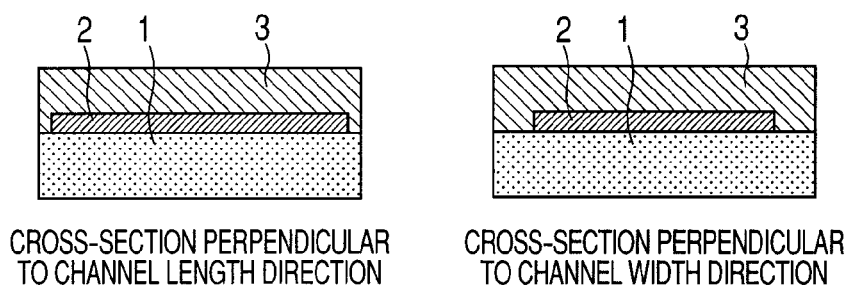

CROSS-SECTION PERPENDICULAR
TO CHANNEL LENGTH DIRECTION

CROSS-SECTION PERPENDICULAR
TO CHANNEL WIDTH DIRECTION

FIG. 10C

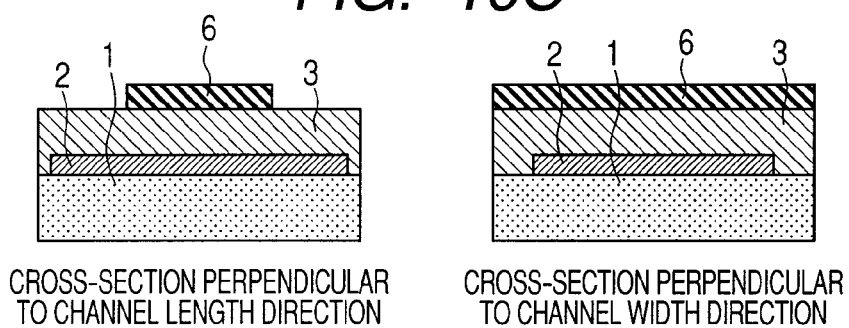

CROSS-SECTION PERPENDICULAR
TO CHANNEL LENGTH DIRECTION

CROSS-SECTION PERPENDICULAR
TO CHANNEL WIDTH DIRECTION

FIG. 10D

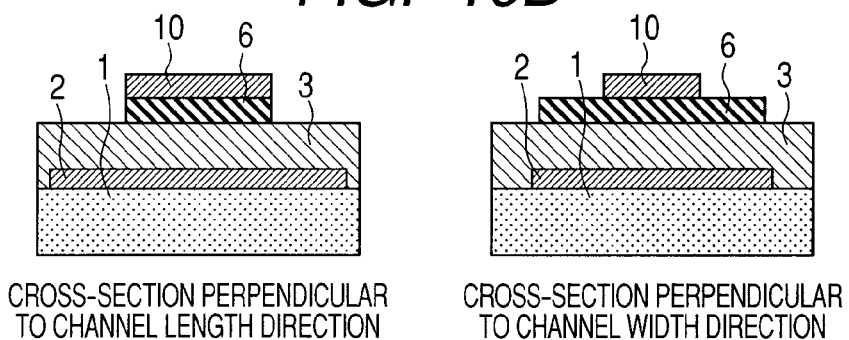

CROSS-SECTION PERPENDICULAR
TO CHANNEL LENGTH DIRECTION

CROSS-SECTION PERPENDICULAR
TO CHANNEL WIDTH DIRECTION

ABSTRACT# THIN FILM TRANSISTOR, DISPLAY DEVICE USING THIN FILM TRANSISTOR, AND PRODUCTION METHOD OF THIN FILM TRANSISTOR

BACKGROUND OF THE INVENTION

1. Field of the Invention

The present invention relates to a thin film transistor, a display device using the thin film transistor, and a production method of the thin film transistor. More particularly, the present invention relates to a double-gate thin film transistor, a display device using the double-gate thin film transistor, and a production method for the double-gate thin film transistor. Note that, in this specification, the term "double-gate" refers to a structure in which gate electrodes are disposed on an upper side (one surface side) and a lower side (another surface side) of a semiconductor layer through an intermediation of gate insulating films.

2. Description of the Related Art

A thin film transistor is a kind of a field-effect transistor and is mainly applied to an active matrix liquid crystal display or an active matrix organic electroluminescence (EL) display. At present, the mainstream is a polycrystalline silicon thin film transistor in which polycrystalline silicon is used as a semiconductor layer and an amorphous silicon thin film transistor in which amorphous silicon is used as a semiconductor layer. With respect to a polycrystalline silicon thin film transistor in which a mobility of electrons is several hundred times as large as that in an amorphous silicon thin film transistor, not only a technology for a type formed at high temperatures but also a technology for a type formed at low temperatures has been completed, and an increase in size of a panel which has been difficult is now expected to be realized. On the other hand, an amorphous silicon thin film transistor is suitable to achieve a large area of a panel and reduce cost in the production process thereof, and has therefore become a mainstream of the thin film transistor and is utilized in various fields.

In recent years, as a new kind of a thin film transistor, a thin film transistor in which a transparent oxide polycrystalline thin film mainly formed of ZnO is used as a semiconductor layer has been actively developed (Japanese Patent Application Laid-Open No. 2002-76356). The above-mentioned thin film may be formed at low temperatures and is transparent to visible light, and thus, a flexible and transparent thin film transistor may be formed on a substrate such as a plastic plate or a film. Further, K. Nomura et al., Nature, Vol. 432 (2004-11), (English version), pp. 488-492 discloses a technology in which a transparent amorphous oxide semiconductor formed of indium, gallium, zinc, and oxygen is used as a semiconductor layer of a thin film transistor. It also describes that a flexible and transparent thin film transistor having a large mobility may be formed on a substrate such as a polyethylene terephthalate (PET) film at a room temperature.

As a common issue for the above-mentioned thin film transistors, there is deterioration of electrical characteristics when the semiconductor layer is exposed to light. Specifically, carriers are generated in the semiconductor layer by light irradiation, and therefore, absolute values of an ON voltage and an OFF current in drain current (Ids)-gate voltage (Vgs) characteristics (transfer characteristics) are increased. In C. van Berkel et al., Journal of Applied Physics, 60 (1986) p. 1521, it is described that an OFF current increases when an amorphous silicon thin film transistor is irradiated with light having a wavelength of 600 nm. Further, in D. P. Gosain et al., 7-2, AM-FPD2008, it is described that the ON voltage is significantly shifted to a negative side when a transparent amorphous oxide semiconductor thin film transistor is irradiated with light beams having various wavelengths. For example, in an active matrix liquid crystal display or an active matrix organic EL display, malfunctions such as deterioration in contrast occur because the OFF current in the transfer characteristics increases. Further, occurrence of the shift in ON voltage makes conspicuous such malfunctions that a desired threshold value which is necessary for operating a circuit may not be obtained or an operating point of the circuit is shifted. For example, a thin film transistor for driving in a pixel circuit of an active matrix organic EL display controls emission intensity of an organic EL device by a current flowing between a drain and a source thereof. Therefore, if the ON voltage is shifted, a malfunction occurs in which desired emission intensity may not be obtained.

In order to solve the above-mentioned problems, the following method is generally used. That is, in order to prevent light irradiation onto a semiconductor part of the thin film transistor, an upper light shielding film and a lower light shielding film, which are formed of a material which shields light, are formed on an upper portion and a lower portion of the thin film transistor, respectively. Further, Japanese Patent Application Laid-Open No. 2002-196362 and Japanese Patent Application Laid-Open No. 2004-170656 disclose a technology in which, in addition to the upper and lower light-shielding layers, a side-wall light-shielding layer for shielding light entering from side surfaces of the semiconductor is formed to be connected to the upper and lower light-shielding layers, to thereby effectively shield light irradiating the polycrystalline silicon semiconductor layer. Further, US 2007-090365 A1 discloses a technology related to a light-shielding layer in a thin film transistor using an oxide semiconductor as the semiconductor layer. According to US 2007-090365 A1, even if a transparent amorphous oxide semiconductor, which is transparent to visible light, is used, when light in a particular visible light region enters, a change in electrical conductivity caused by light occurs. However, by forming light-shielding layers separately from a source electrode, a drain electrode, a gate electrode, and an active layer, the thin film transistor may be more stably operated.

According to the inventions disclosed in Japanese Patent Application Laid-Open No. 2002-196362, Japanese Patent Application Laid-Open No. 2004-170656, and US 2007-090365 A1, all the upper, lower, and side-wall light-shielding layers are formed separately from layers constituting the thin film transistor, that is, the gate electrode, the gate insulating film, the active layer, the source electrode, and the drain electrode. Therefore, steps of forming the light-shielding layers are necessary separately from the steps of forming the thin film transistor, which leads to an increase in the number of production steps.

SUMMARY OF THE INVENTION

The present invention has been made in view of the above-mentioned problems, and therefore has an object to provide a thin film transistor having a light-shielding ability equaling or surpassing that of the prior art and a display device using the thin film transistor, without increasing the number of production steps.

According to the present invention, as a method for solving the above-mentioned problems, there is provided a thin film transistor including: a first gate electrode; a first gate insulating layer covering the first gate electrode; a semiconductor layer disposed on the first gate insulating layer; a second gate insulating layer disposed on the semiconductor layer; a second gate electrode disposed on the second gate insulating layer; and a drain electrode and a source electrode which are electrically connected to the semiconductor layer, in which: the semiconductor layer is an amorphous oxide semiconductor containing at least one of Zn, Ga, In, and Sn; the first gate electrode shields light entering the semiconductor layer from below, and the second gate electrode shields light entering the semiconductor layer from above; and the second gate electrode is electrically connected to the first gate electrode by penetrating the first gate insulating layer and the second gate insulating layer, to thereby shield light entering the semiconductor layer from at least one of sides thereof.

According to the present invention, a thin film transistor having a light-shielding ability equaling or surpassing that of a thin film transistor surrounded by the light-shielding layers, and a display device using the thin film transistor, may be obtained without increasing the number of production steps.

Further features of the present invention will become apparent from the following description of exemplary embodiments with reference to the attached drawings.

BRIEF DESCRIPTION OF THE DRAWINGS

FIGS. 10A, 10B, 10C, 10D, 10E, 10F and 10G are cross-sectional views illustrating production steps of a thin film transistor according to a seventh embodiment of the present invention.

DESCRIPTION OF THE EMBODIMENTS

Figure 1:
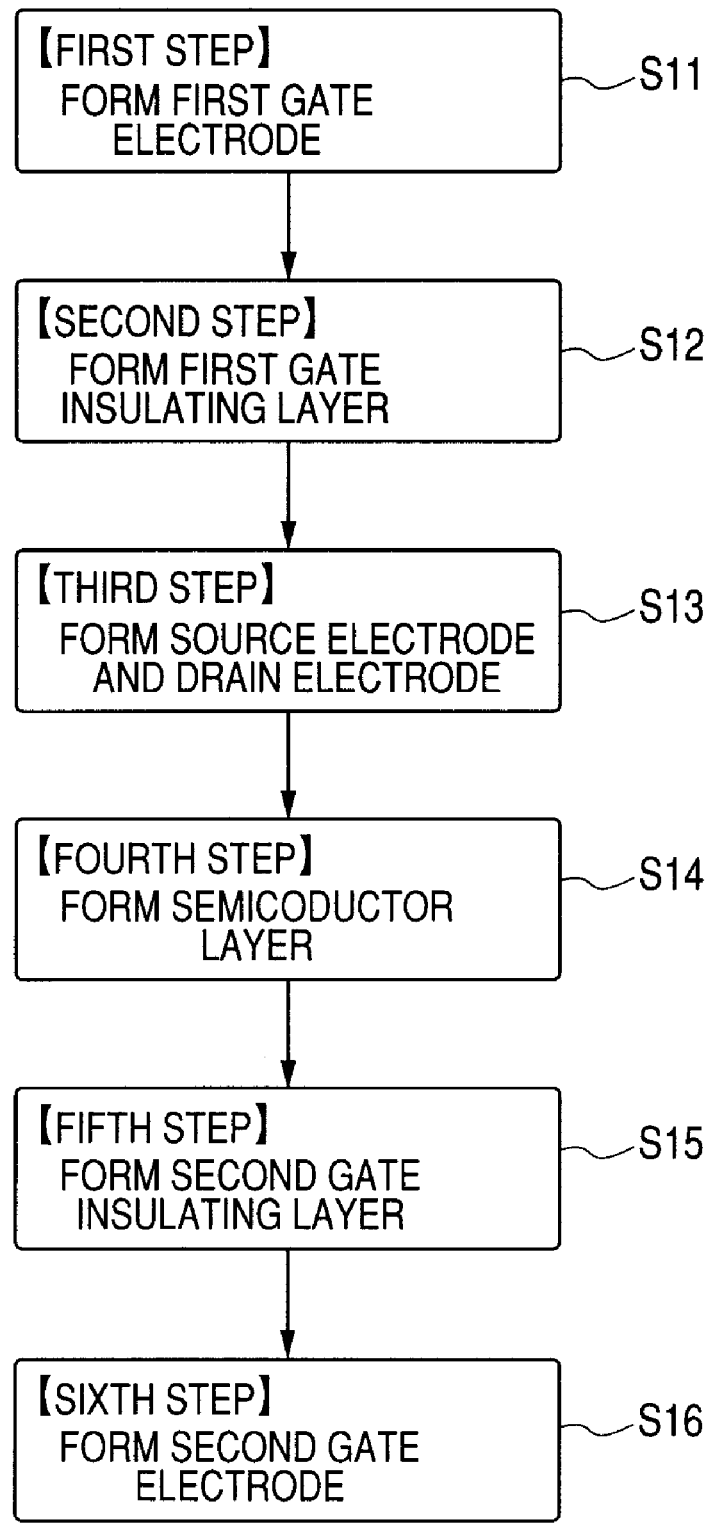
FIG. 1 is a flow chart illustrating production steps of a thin film transistor according to a best mode for carrying out the present invention.

Hereinafter, a best mode for carrying out the present invention is described with reference to the attached drawings. A method of producing a thin film transistor includes six steps as illustrated in a flow chart of FIG. 1. FIGS. 2A to 2H are cross-sectional views illustrating production steps of the thin film transistor according to an embodiment mode of the present invention. Although a bottom-contact type thin film transistor is illustrated as the thin film transistor in FIGS. 2A to 2H, the structure of the thin film transistor is not limited thereto, and may be a top-contact type or a planar type. In FIGS. 2A to 2H, thin film transistors having two types of structure (FIGS. 2G and 2H), which are classified by how a side-wall light-shielding layer is provided, are described. Both of the thin film transistors are double-gate driven thin film transistors, and hence both of the thin film transistors are similar in terms of having higher current capability than single-gate driven thin film transistors.

Figure 2A:
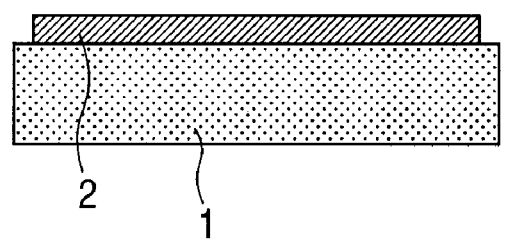
FIGS. 2A, 2B, 2C, 2D, 2E, 2F, 2G and 2H are cross-sectional views illustrating production steps of a thin film transistor according to an embodiment mode of the present invention.
Figure 2B:
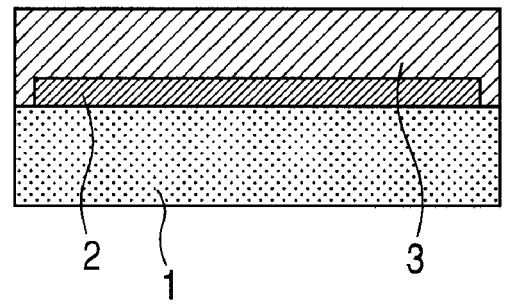
Figure 2C:
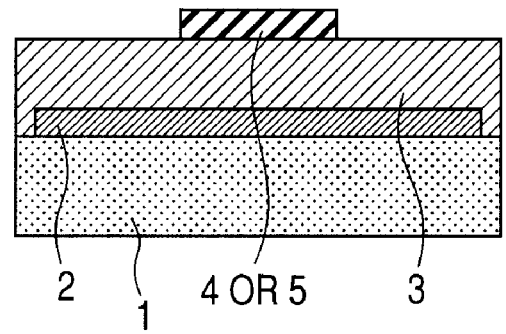
Figure 2D:
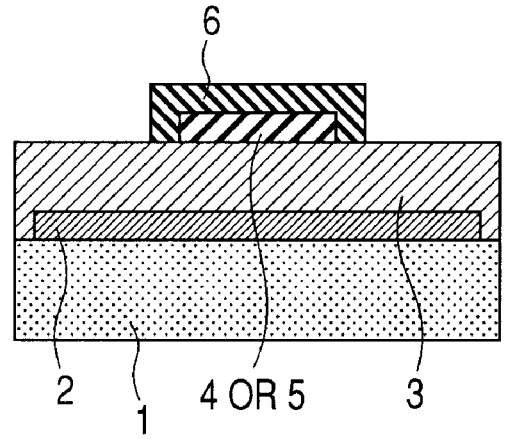
Figure 2E:
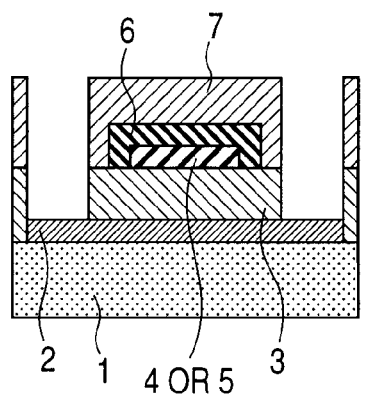
Figure 2F:
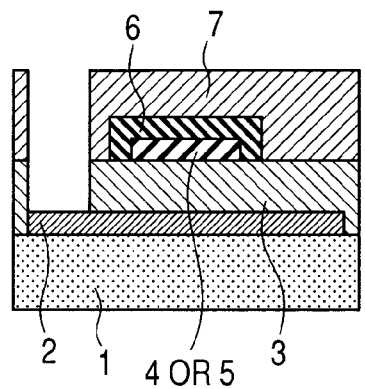
Figure 2G:
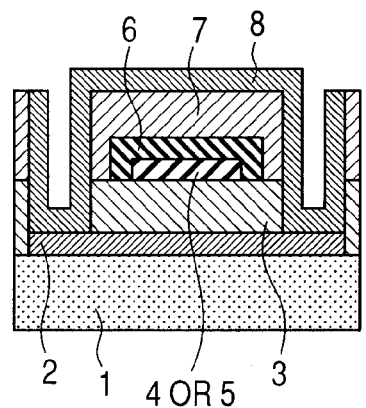
Figure 2H:
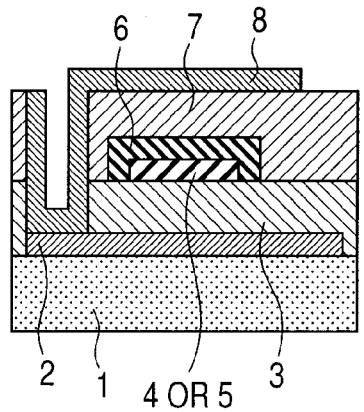

In one of the thin film transistors, a contact hole is formed on only one side of a semiconductor layer, and hence an area occupied by elements may be reduced (FIG. 2H). However, because the side-wall light-shielding layer is formed only on one side of the semiconductor layer, treatment for improving light-shielding ability, such as arranging the thin film transistors adjacent to each other or arranging the thin film transistors adjacent to wiring having light-shielding ability, is necessary. Any suitable type of the thin film transistors may be selected depending on a use situation.

As illustrated in FIGS. 2G and 2H, the thin film transistor has a structure in which a first gate electrode 2, a first gate insulating layer 3, a source electrode 4, a drain electrode 5, a semiconductor layer 6, a second gate insulating layer 7, and a second gate electrode 8 are laminated in the stated order on a substrate 1.

The substrate 1 is an insulating substrate. For example, the substrate 1 may be a glass substrate. When an organic material or a polymeric material such as polyethylene terephthalate (PET) is used as the substrate 1, a thin film transistor may be produced on a flexible substrate.

First, as a first step, a first conductive film is formed on the substrate 1. A film formed of a metal is used as the first conductive film. Alternatively or additionally, a conductive metal oxide ($MO_x$, where M represents metallic element) may be used. A transmittance of the first conductive film to visible light is, in terms of light shielding, preferably 1% or less, more preferably, 0.1% or less, and particularly preferably, 0.01% or less.

The first conductive film may include a single layer or a laminate of multiple films. As a film formation method for the first conductive film, a vapor phase method such as sputtering, pulse laser vapor deposition, or electron beam vapor deposition is preferred to be used. However, the film formation method is not limited to the methods described above. Then, the first conductive film is patterned, to thereby form the first gate electrode 2 (Step S11 of FIG. 1). A structure formed by the process up to this step is illustrated in FIG. 2A.

Next, as a second step, a first insulator film is formed on the first gate electrode 2. The first insulator film is formed of an inorganic material selected from the group consisting of oxide, carbide, nitride, fluoride, and a compound thereof. For example, a metal oxide film containing at least one kind of metallic element is used as the first insulator film. Among the metal oxides, it is more preferred to use as the insulator film a metal oxide containing at least one of the following:

$SiO_2$, $Al_2O_3$, $Ga_2O_3$, $In_2O_3$, $MgO$, $CaO$, $SrO$, $BaO$, $ZnO$, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$, and $Yb_2O_3$.

Alternatively or additionally, a metal nitride ($MN_x$, where M represents metallic element) typified by $SiN_x$ may be used.

Further, alternatively or additionally, a metal oxynitride ($MO_xN_y$, where M represents metallic element) typified by $SiO_xN_y$ may be used.

As a film formation method for the first insulator film, a vapor phase method such as chemical vapor deposition, sputtering, pulse laser vapor deposition, or electron beam vapor deposition is preferred to be used. However, the film formation method is not limited to the methods described above. Then, the first insulator film is patterned, to thereby form the first gate insulating layer 3 covering the first gate electrode 2 (Step S12 of FIG. 1). A structure formed by the process up to this step is illustrated in FIG. 2B.

Next, as a third step, a second conductive film is deposited on the first gate insulating layer 3. As the second conductive film, a film containing at least one kind of metal, typified by Mo, is used. Alternatively or additionally, a metal oxide ($MO_x$, where M represents metallic element) typified by indium tin oxide (ITO) may be used. The second conductive film may include a single layer or a laminate of multiple films. As a film formation method for the second conductive film, a vapor phase method such as sputtering, pulse laser vapor deposition, or electron beam vapor deposition is preferred to be used. However, the film formation method is not limited to the methods described above. Then, the second conductive film is patterned, to thereby form the source electrode 4 and the drain electrode 5 (Step S13 of FIG. 1). A structure formed by the process up to this step is illustrated in FIG. 2C.

Next, as a fourth step, on the first gate insulating layer 3, the source electrode 4, and the drain electrode 5, a semiconductor film is formed. There is a negative correlation between a band gap and intrinsic carrier density in a semiconductor, and hence as the band gap increases, the intrinsic carrier density decreases. A square of the intrinsic carrier density is equal to a product of majority carrier density and minority carrier density, and hence when majority carrier concentration is constant, minority carrier concentration decreases. The number of minority carriers are preferred to be few because the minority carriers form an inversion layer in the semiconductor layer, and cause an increase of an OFF current in transfer characteristics of the thin film transistor. As a result of a detailed study by the inventors, it is found that, if the band gap of the semiconductor is equal to or larger than 3 eV, an inversion layer having possibility to influence the transfer characteristics is not formed. Therefore, the semiconductor film is preferred to have a band gap which is equal to or larger than 3 eV. More desirably, as the semiconductor film, an amorphous oxide semiconductor containing at least one kind of Zn, Ga, In, and Sn is used. By using amorphous oxide, large-area uniformity and short-range uniformity in electric characteristics of the thin film transistor may be improved owing to an amorphous property of the semiconductor layer.

One of the problems which arises when a thin film transistor is produced and used is a so-called "hump" which appears in drain current (Ids)-gate voltage (Vgs) characteristics (transfer characteristics). Occurrence of the hump makes conspicuous such malfunctions that a desired threshold value which is necessary for operating a circuit may not be obtained or an operating point of the circuit is shifted. When a polysilicon thin film transistor has a mesa isolation structure, a sub-channel transistor is formed in a semiconductor layer region which overlaps a gate electrode. In the sub-channel transistor, a current path is formed at a pattern edge or vicinity of a semiconductor film. Here, "mesa isolation structure" refers to an isolation structure through mesa isolation. In a thin film transistor having a mesa isolation structure, because an electric field concentrates on a side wall portion of the semiconductor film, the sub-channel transistor in the side wall portion is easily turned ON compared with a thin film transistor formed of other portions thereof. Therefore, in the transfer characteristics, the hump appears because the sub-channel transistor is turned ON, that is, because of parasitic characteristics. However, in the case of the above-mentioned thin film transistor in which an oxide semiconductor is used for a semiconductor layer, the mechanism of transistor operation is different from that of a polysilicon thin film transistor. That is, in the oxide semiconductor thin film transistor, as the electric field is more intensely applied, the OFF state is maintained in a more stable manner. Therefore, even when a thin film transistor having a mesa isolation structure is used, hump formation in the transfer characteristics may be prevented. For this reason, an oxide semiconductor is preferred to be used as the semiconductor film. Note that, the oxide semiconductor of the present invention refers to an oxide semiconductor which changes, when used as an active layer in a thin film transistor, a drain current by at least two orders of magnitude between the ON state and the OFF state.

As a film formation method for the semiconductor film, a vapor phase method such as sputtering, pulse laser vapor deposition, or electron beam vapor deposition, or a liquid phase method such as spin coating, doctor blading, screen printing, and ink jet printing is preferred to be used. However, the film formation method is not limited to the methods described above. Then, the semiconductor film is patterned, to thereby form the semiconductor layer 6 (Step S14 of FIG. 1). A structure formed by the process up to this step is illustrated in FIG. 2D.

Next, as a fifth step, a second insulator film is formed on the semiconductor layer 4. The second insulator film is formed of an inorganic material selected from the group consisting of oxide, carbide, nitride, fluoride, and a compound thereof. For example, as the second insulator film, a metal oxide film containing at least one kind of metallic element is used. Among the metal oxides, it is more preferred to use as the second insulator film a metal oxide containing at least one of the following:

$SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$, and $Yb_2O_3$. Alternatively or additionally, a metal nitride ($MN_x$, where M represents metallic element) typified by $SiN_x$ may be used. Further, alternatively or additionally, a metal oxynitride ($MO_xN_y$, where M represents metallic element) typified by $SiO_xN_y$ may be used. As a film formation method for the second insulator film, a vapor phase method such as chemical vapor deposition, sputtering, pulse laser vapor deposition, or electron beam vapor deposition is preferred to be used. However, the film formation method is not limited to the methods described above. Then, the second insulator film is patterned, to thereby form the second gate insulating layer 7 (Step S15 of FIG. 1). In this case, the first gate insulating layer 3 is simultaneously patterned so as to expose the first gate electrode 2, to thereby form a contact hole. The contact hole is formed so that a width of an orthogonal projection in a channel length direction of the thin film transistor to be light shielded is larger than the channel length of the thin film transistor. Further, in this case, whether to form contact holes on both sides sandwiching the semiconductor layer 6 (FIG. 2E), or to form a contact hole only on one side (FIG. 2F) may be selected.

Next, as a sixth step, a third conductive film is formed on the second gate insulating layer 7. As the third conductive film, a film formed of a metal typified by Mo is used. Alternatively, a metal oxide ($MO_x$, where M represents metallic element) typified by ITO may be used. The third conductive film may include a single layer or a laminate of multiple films. A transmittance of the third conductive film to visible light is, in terms of light shielding, preferably 1% or less, more preferably, 0.1% or less, and particularly preferably, 0.01% or less. As a film formation method for the third conductive film, a vapor phase method such as sputtering, pulse laser vapor deposition, or electron beam vapor deposition is preferred to be used. However, the film formation method is not limited to the methods described above. Then, the third conductive film is patterned, to thereby form the second gate electrode 8 (Step S16 of FIG. 1). Structures formed by the process up to this step are illustrated in FIGS. 2G and 2H. Note that, in FIG. 2H, by elongating the second gate electrode 8 extending on a side opposite to a portion where the first gate electrode 2 and the second gate electrode 8 are connected, that is, on a right side of FIG. 2H, the light-shielding ability may be improved. Similarly, by elongating the first gate electrode 2, the light-shielding ability may be improved.

An example of the production steps for the thin film transistor of the present invention has been described above. The first gate electrode serves as a light-shielding layer for shielding light entering the semiconductor layer from below, and the second gate electrode serves as a light-shielding layer for shielding light entering the semiconductor layer from above. Therefore, light-shielding layers may be provided without increasing the number of production steps. Further, compared with a conventional technology, the light-shielding layers are formed at positions spatially close to the semiconductor layer, and hence higher light-shielding ability may be obtained. At this time, the second gate electrode is electrically connected to the first gate electrode by penetrating the first gate insulating layer and the second gate insulating layer, to thereby serve as a side-wall light-shielding layer for shielding light entering the semiconductor layer from sides. In this manner, high light-shielding ability is obtained also against light entering the semiconductor layer from the sides. In addition, the first gate electrode and the second gate electrode are electrically connected to each other, and hence a large number of carriers are induced in the semiconductor layer by the electric field effect from both upper and lower directions. Therefore, the thin film transistor may have high drive ability. Note that, as long as the semiconductor layer is an amorphous oxide semiconductor containing at least one of Zn, Ga, In, and Sn, the thin film transistor may employ any structure to obtain the above-mentioned effect. That is, from the perspective of a method of connecting a channel portion and the source/drain electrode, the present invention is applicable to top-contact type thin film transistors and bottom-contact type thin film transistors (both types are similar in case of double-gate structure), and coplanar type thin film transistors. Further, from the perspective of the treatment method of the upper surface of the semiconductor layer, the present invention is applicable to channel-etch type thin film transistors and channel-protection type thin film transistors. However, the same effect may not be obtained by applying the method described above to a channel-etch type hydrogenated amorphous silicon thin film transistor, which is one of the thin film transistors widely used at present. The reason is as described below. In the channel-etch type hydrogenated amorphous silicon thin film transistor, an upper side surface of the semiconductor layer is etched by dry etching, and hence a large number of etching-induced damages, for example, defects remain. The damages or defects are incapable of being removed in the subsequent steps. If the top-gate (one side) drive is performed in this state, a channel is formed in a thickness range where the damages are included, and hence an increase in hysteresis in the transfer characteristics, deterioration of subthreshold characteristics, and characteristic deterioration such as reduction in stress tolerance mainly occur. Therefore, the channel-etch type hydrogenated amorphous silicon thin film transistor is usually bottom-gate driven, and is not top-gate driven. From the reason described above, when the channel-etch type hydrogenated amorphous silicon thin film transistor is double-gate driven, a channel is also formed on the back channel side of the semiconductor, and hence the thin film transistor is affected by the characteristic deterioration described above. Therefore, the characteristics are more deteriorated than a case where the bottom-gate (one-side gate) driven thin film transistor with similar element structure is used.

On the other hand, as a result of an extensive study by the inventors, it has been made apparent that when the semiconductor layer is an amorphous oxide semiconductor containing at least one of Zn, Ga, In, and Sn, the characteristic deterioration as described above may be suppressed through steps described below. The steps are roughly classified into two types. The steps may provide effects not only when a step of one type is carried out alone but also when steps of both types are carried out in combination.

The first type step is a step of removing a surface layer of the semiconductor layer, where a large number of defects are included, by additional etching, the defects being formed when etching is performed to form the source and drain electrodes during the production of the channel-etch type thin film transistor. The additional etching may be wet etching in terms of reducing damage which may be applied to the semiconductor layer.

Figure 5:
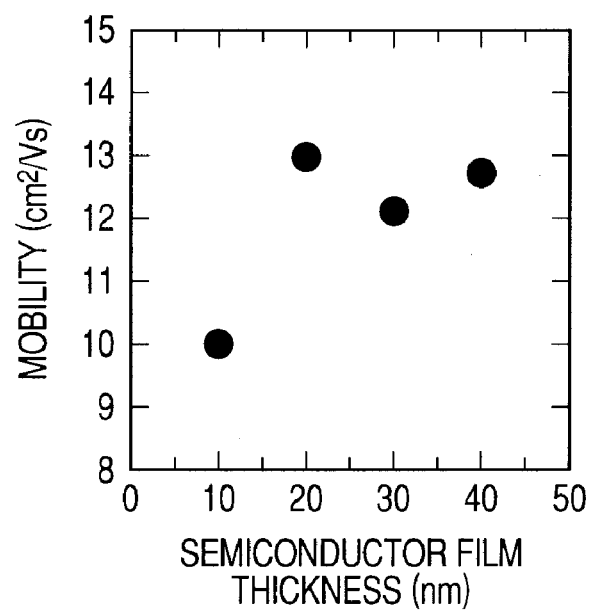
FIG. 5 shows data of semiconductor film thickness dependency of mobility in a thin film transistor which uses an amorphous In—Ga—Zn—O thin film as a semiconductor layer.

FIG. 5 illustrates semiconductor film thickness dependence of mobility in the thin film transistor using an amorphous In—Ga—Zn—O thin film as the semiconductor layer. When the semiconductor film thickness was 10 nm, mobility deterioration was observed. Therefore, an etching depth of the semiconductor layer is set, when the thickness of the semiconductor layer is d, equal to or larger than 1 nm and equal to or smaller than (d−10) nm. It is difficult to etch less than 1 nm in terms of controllability, and etching more than (d−10) nm leads to mobility deterioration as described above.

Figure 6A:
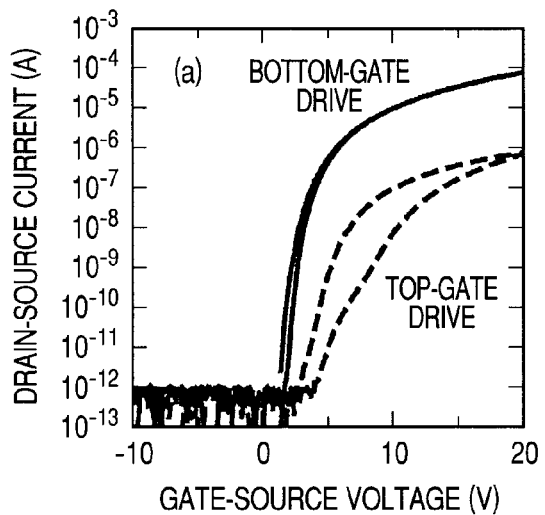
FIGS. 6A and 6B illustrate transfer characteristics of a channel-etch type thin film transistor which uses an amorphous In—Ga—Zn—O thin film as a semiconductor layer.
Figure 6B:
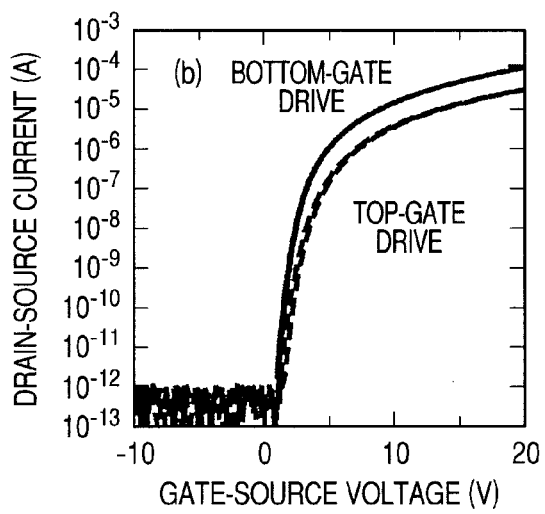

Further, FIG. 6A illustrates transfer characteristics of a thin film transistor in which etching of the semiconductor layer was not performed, and FIG. 6B illustrates transfer characteristics of a thin film transistor in which etching of the semiconductor layer was performed by 10 nm. Characteristics when top-gate drive and bottom-gate drive were performed are illustrated in each drawings. When the semiconductor layer was not etched, a difference of characteristics when top-gate drive and bottom-gate drive were performed was large. In particular, large hysteresis was observed when top-gate drive was performed (FIG. 6A). On the other hand, when the semiconductor layer was etched by 10 nm, both characteristics were almost the same, and the large hysteresis observed when top-gate drive was performed in FIG. 6A was not observed. Based on the experiment results, the etching depth of the semiconductor layer is preferred to be equal to or larger than 10 nm and equal to or smaller than (d−10) nm. Note that, although data is not shown in this specification, by performing wet etching to the semiconductor layer as described above, improvement in subthreshold characteristics and stress tolerance in the transfer characteristics have been confirmed. Therefore, by keeping the etching depth within the above-mentioned range, a thin film transistor, which does not include a layer having many defects and has stable performance, may be obtained.

Figure 7:
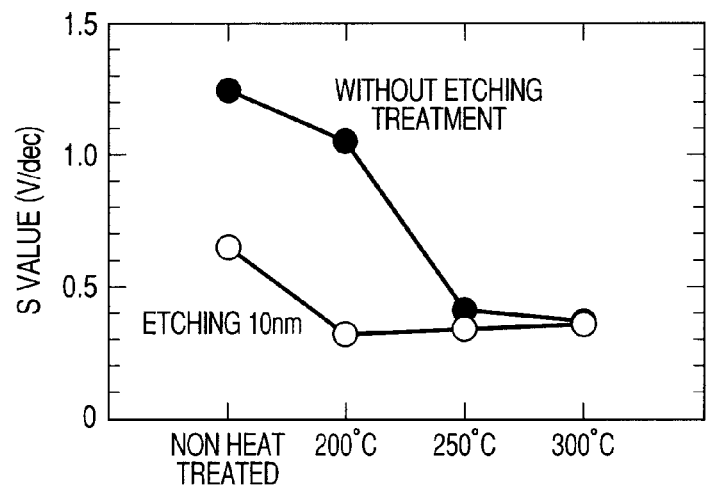
FIG. 7 shows data of heat treatment temperature dependency of an S value of the channel-etch type thin film transistor which uses the amorphous In—Ga—Zn—O thin film as the semiconductor layer.

The second type step is a heat treatment step. FIG. 7 illustrates heat treatment temperature dependence of an S value in channel-etch type thin film transistors using the amorphous In—Ga—Zn—O thin film. The heat treatment was performed after the production of the thin film transistor was completed, and a heat treatment time period was always an hour. In FIG.

7, two types of results corresponding to whether or not wet etching treatment was performed to the semiconductor layer are illustrated. When paying attention to a case where etching treatment was not performed, reduction of the S value was observed by performing heat treatment at a temperature equal to or higher than 200° C. This indicates that the increase of the S value, due to a large number of defects formed on the surface layer of the semiconductor layer when etching is performed so as to form the source and drain electrodes as described above, may be suppressed by heat treatment. Therefore, the heat treatment temperature is set equal to or larger than 200° C. and equal to or smaller than 500° C. The upper limit of the heat treatment temperature is set 500° C. because the semiconductor layer crystallizes when heat treatment is performed at a temperature larger than 500° C., which leads to deterioration of short-range uniformity in device characteristics. Further, it is apparent from FIG. 7 that, when heat treatment is performed at a temperature equal to or larger than 250° C., the S value thereof becomes similar to that in a case where the semiconductor layer is subjected to wet etching treatment. Based on the experiment results, the heat treatment temperature is preferred to be equal to or larger than 250° C. and equal to or smaller than 500° C. Note that, although data is not shown in this specification, it has been confirmed that, by performing the heat treatment as described above, reduction in hysteresis and improvement in stress tolerance in the transfer characteristics are obtained. The above-mentioned effects are provided as long as the heat treatment described above is performed after a step of forming an insulating layer on the semiconductor layer.

As described above, subsequent steps including wet etching treatment performed after the etching for forming the source and drain electrodes or heat treatment at a temperature equal to or larger than 200° C. are performed. It has been made apparent that, by performing the subsequent steps, the characteristic deterioration described above, which is observed in the channel-etch type hydrogenated amorphous silicon thin film transistor, does not occur. Therefore, this embodiment mode is appropriate for a thin film transistor in which the semiconductor layer is an amorphous oxide semiconductor containing at least one of Zn, Ga, In, and Sn.

[EMBODIMENTS]

Hereinafter, specific embodiments of the present invention are described in detail.

(First Embodiment)

Figure 3A:
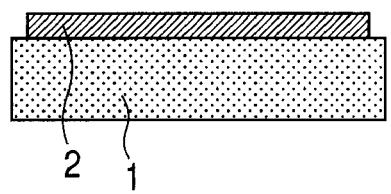
FIGS. 3A, 3B, 3C, 3D, 3E and 3F are cross-sectional views illustrating production steps of a thin film transistor according to a first embodiment of the present invention.
Figure 3B:
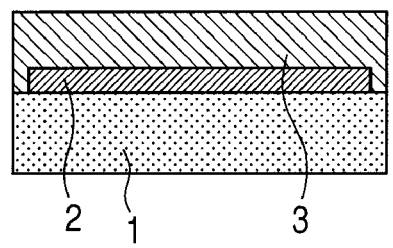
Figure 3C:
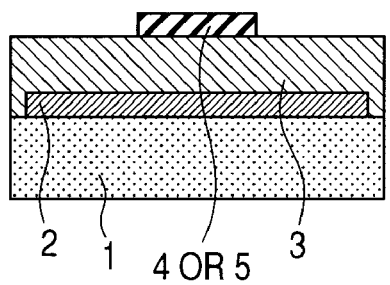
Figure 3D:
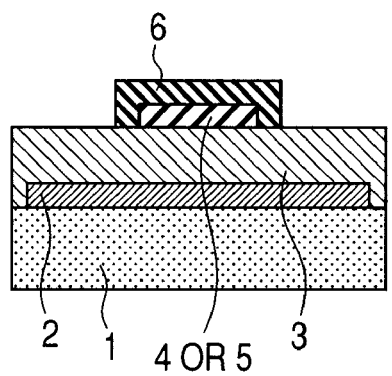
Figure 3E:
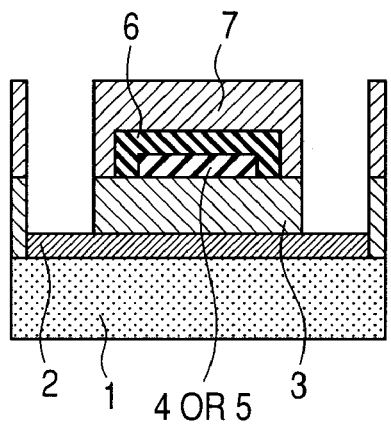
Figure 3F:
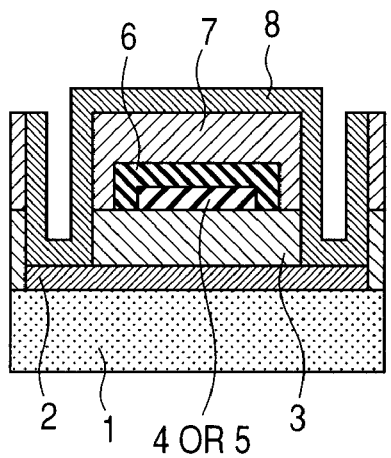

FIG. 3F is a cross-sectional view illustrating a structure of a thin film transistor according to a first embodiment of the present invention. As illustrated in FIG. 3F, this embodiment is an example of a bottom-contact type thin film transistor. The thin film transistor illustrated in FIGS. 3A to 3F is formed on the substrate 1. More specifically, the first gate electrode 2, the first gate insulating layer 3, the source electrode 4, the drain electrode 5, the semiconductor layer 6, the second gate insulating layer 7, and the second gate electrode 8 are formed on the substrate 1.

A glass substrate (Corning 1737) is used as the substrate 1. A thickness of the glass substrate is 0.5 mm. First, an Mo thin film with a thickness of 100 nm is formed on the substrate 1. In this embodiment, DC magnetron sputtering using an atmosphere of an argon gas is used to form the Mo thin film. Then, the deposited Mo thin film is processed by photolithography and dry etching, to thereby form the first gate electrode 2 (FIG. 3A).

Then, an $SiO_2$ thin film is formed on the first gate electrode 2 at a thickness of 200 nm by plasma CVD. With respect to the film formation conditions, a substrate temperature is set to 340° C., an input RF power is set to 360 W, process gases are $SiH_4$ and $N_2O$ and flow rates thereof are set to 24 sccm and 600 sccm, respectively, and a chamber pressure is set to 150 Pa. Then, the deposited $SiO_2$ thin film is patterned by photolithography and dry etching, to thereby form the first gate insulating layer 3 (FIG. 3B). Note that, 1 sccm is $1.69 \times 10^{-4}$ Pa·m$^3$/sec. Then, on the first gate insulating layer 3, an ITO thin film is formed at a thickness of 30 nm by DC magnetron sputtering. With respect to the film formation conditions, the substrate temperature is set to a room temperature, the input RF power is set to 200 W, the supply flow rate of the argon gas is set to 100 sccm, and the chamber pressure is set to 0.2 Pa. The ITO thin film formed in this way is amorphous. Next, the deposited ITO thin film is processed by photolithography and wet etching. Next, the processed ITO thin film is made to be a polycrystalline ITO thin film by heat treatment at 270° C. for 20 minutes, to thereby form the source electrode 4 and the drain electrode 5 (FIG. 3C).

Then, on the first gate insulating layer 3, the source electrode 4, and the drain electrode 5, a thin film of an oxide semiconductor In—Ga—Zn—O is formed at a thickness of 40 nm by DC magnetron sputtering. With respect to the film formation conditions, the substrate temperature is set to the room temperature, the input RF power is set to 200 W, the flow rate of a mixed gas of argon and oxygen is set to 25 sccm, and the chamber pressure is set to 0.5 Pa. The In—Ga—Zn—O thin film formed in this way is amorphous, and a composition ratio of In:Ga:Zn:O is substantially 1:1:1:4. Next, the deposited In—Ga—Zn—O thin film is patterned by photolithography and wet etching using hydrochloric acid, to thereby form the semiconductor layer 6 (FIG. 3D).

Next, an $SiO_2$ thin film is formed over the semiconductor layer 6 at a thickness of 200 nm by plasma CVD. With respect to the film formation conditions, the substrate temperature is set to 250° C., the input RF power is set to 360 W, the process gases are $SiH_4$ and $N_2O$ and flow rates thereof are set to 24 sccm and 600 sccm, respectively, and the chamber pressure is set to 150 Pa. Next, the deposited $SiO_2$ thin film is patterned by photolithography and dry etching, to thereby form the second gate insulating layer 7. In this case, the first gate insulating layer 3 is simultaneously etched, to thereby expose the first gate electrode 2 (FIG. 3E).

Next, an Mo thin film is formed on the second gate insulating layer 7 at a thickness of 200 nm. The film formation conditions for the second gate insulating layer 7 are the same as those in the formation of the first gate electrode. Next, the deposited Mo thin film is finely processed by photolithography and dry etching, to thereby form the second gate electrode 8 (FIG. 3F).

The thin film transistor produced as described above has characteristics of both high light-shielding ability and high drive ability.

The drive ability was evaluated in terms of the transfer characteristics. The ON current in the double-gate thin film transistor was about 2.5 times as that in the bottom-gate (one-side gate) driven thin film transistor formed of a similar element structure.

The light-shielding ability was evaluated by measuring the transfer characteristics before and after the thin film transistor was irradiated with ultraviolet (UV) light. Changes that may occur by irradiating the thin film transistor with UV light are a shift in rising voltage and an increase in OFF current. In the thin film transistor of this embodiment, the shift in rising voltage was less than 1 V, and the OFF current was less than $10^{-10}$ A.

(Second Embodiment)

Figure 4A:
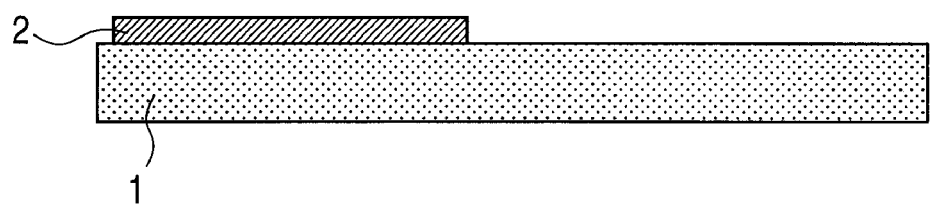
FIGS. 4A, 4B, 4C, 4D, 4E, 4F, 4G and 4H are cross-sectional views illustrating production steps of a thin film transistor according to a second embodiment of the present invention.
Figure 4B:
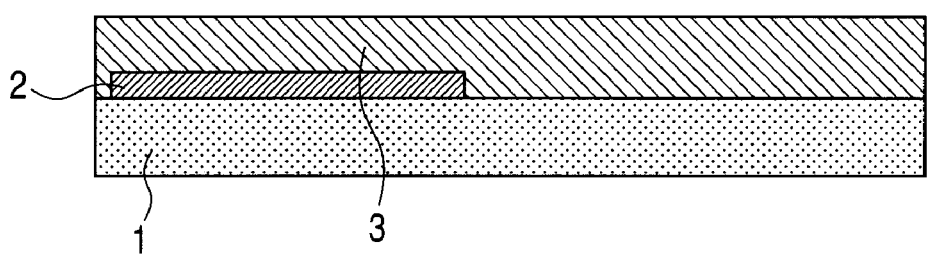
Figure 4C:
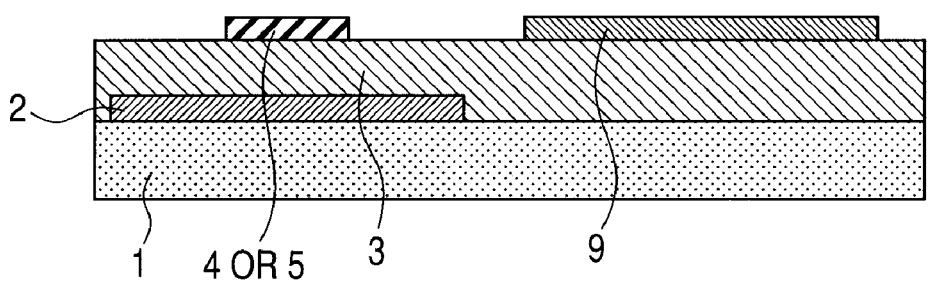
Figure 4D:
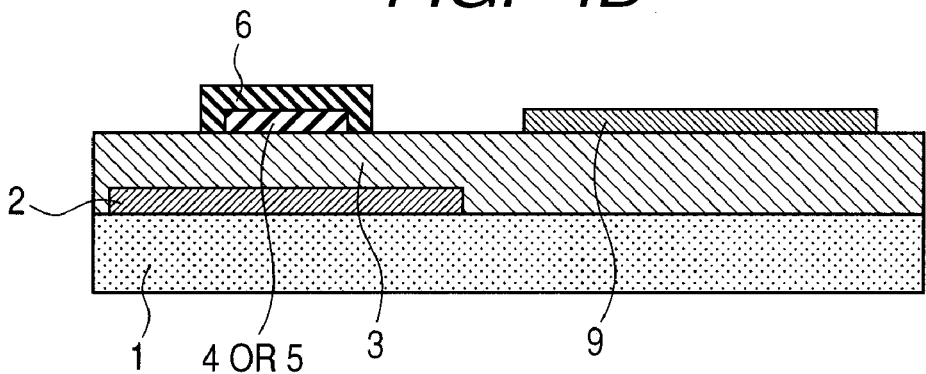
Figure 4E:
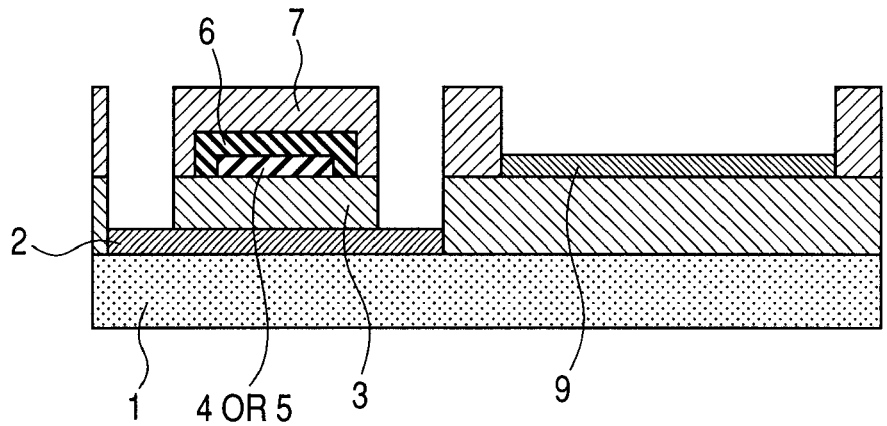
Figure 4F:
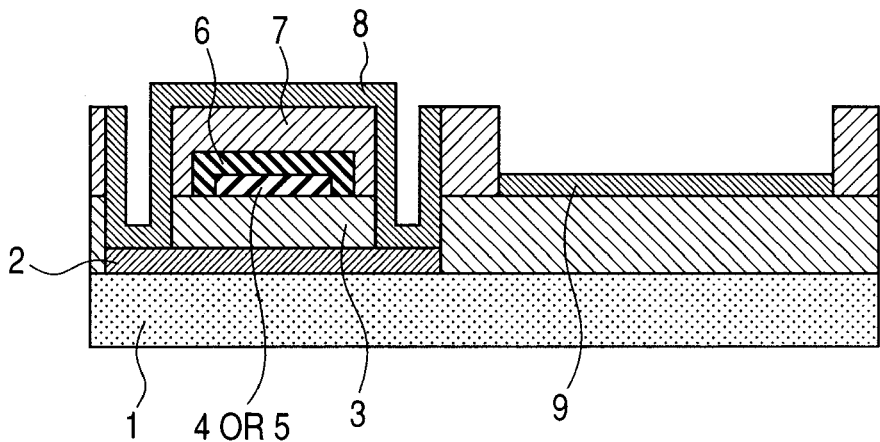
Figure 4G:
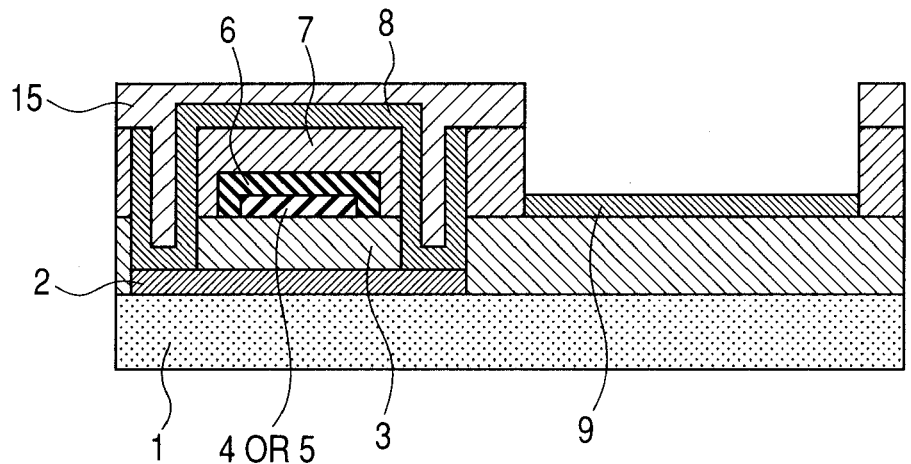
Figure 4H:
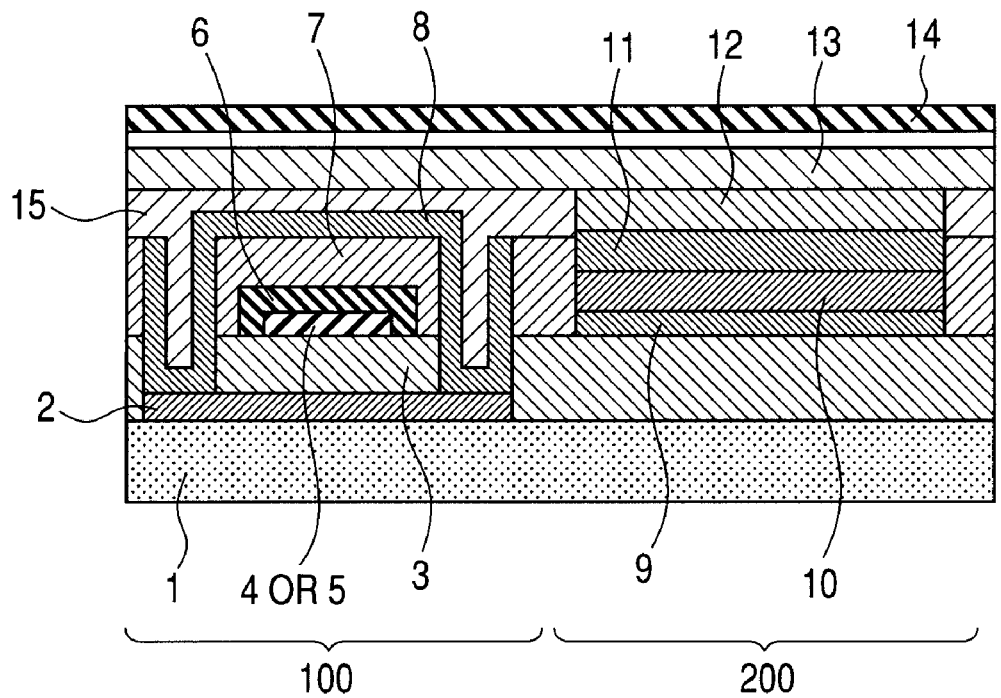

FIG. 4H is a cross-sectional view illustrating a structure of a display device according to a second embodiment of the present invention. As illustrated in FIG. 4H, the display device according to this embodiment includes the thin film transistor described in the first embodiment and an organic EL element. A thin film transistor 100 illustrated in FIG. 4H is formed on the substrate 1. More specifically, the thin film transistor 100 includes the first gate electrode 2, the first gate insulating layer 3, the source electrode 4, the drain electrode 5, the semiconductor layer 6, the second gate insulating layer 7, and the second gate electrode 8. In addition, an organic EL element 200 illustrated in FIG. 4H is formed on the first gate insulating layer 3. More specifically, the organic EL element 200 includes a transparent anode electrode 9, a hole injecting layer 10, an organic light emitting layer 11, an electron injecting layer 12, and a cathode electrode 13. Further, a glass sealing layer 14 is formed so as to cover the entire element.

A glass substrate (Corning 1737) is used as the substrate 1. A thickness of the glass substrate is 0.5 mm. First, an Mo thin film is formed at a thickness of 100 nm on the substrate 1. In this embodiment, DC magnetron sputtering using an atmosphere of an argon gas is used to form the Mo thin film. Next, the deposited Mo thin film is processed by photolithography and dry etching, to thereby form the first gate electrode 2 (FIG. 4A).

Then, an $SiO_2$ thin film is formed on the first gate electrode 2 at a thickness of 200 nm by plasma CVD. With respect to the film formation conditions, the substrate temperature is set to 340° C., the input RF power is set to 360 W, the process gases are $SiH_4$ and $N_2O$ and flow rates thereof are set to 24 sccm and 600 sccm, respectively, and the chamber pressure is set to 150 Pa. Then, the deposited $SiO_2$ thin film is patterned by photolithography and dry etching, to thereby form the first gate insulating layer 3 (FIG. 4B).

Next, on the first gate insulating layer 3, an ITO thin film is formed at a thickness of 30 nm by DC magnetron sputtering. With respect to the film formation conditions, the substrate temperature is set to the room temperature, the input RF power is set to 200 W, the supply flow rate of the argon gas is set to 100 sccm, and the chamber pressure is set to 0.2 Pa. The ITO thin film deposited in this way is amorphous. Next, the deposited ITO thin film is processed by photolithography and wet etching. Next, the processed ITO thin film is made to be a polycrystalline ITO thin film by heat treatment at 270° C. for 20 minutes, to thereby form the source electrode 4, the drain electrode 5, and the transparent anode electrode 9 (FIG. 4C).

Next, on the first gate insulating layer 3, the source electrode 4, and the drain electrode 5, a thin film of an oxide semiconductor In—Ga—Zn—O is formed at a thickness of 40 nm by DC magnetron sputtering. With respect to the film formation conditions, the substrate temperature is set to the room temperature, the input RF power is set to 200 W, the supply flow rate of a mixed gas of argon and oxygen is set to 25 sccm, and the chamber pressure is set to 0.5 Pa. The In—Ga—Zn—O thin film deposited in this way is amorphous, and a composition ratio of In:Ga:Zn:O is substantially 1:1:1:4. Next, the deposited In—Ga—Zn—O thin film is processed by photolithography and wet etching using hydrochloric acid, to thereby form the semiconductor layer 6 (FIG. 4D).

Next, on the semiconductor layer 6, an $SiO_2$ thin film is formed at a thickness of 200 nm by plasma CVD. With respect to the film formation conditions, the substrate temperature is set to 250° C., the input RF power is set to 360 W, the process gases are $SiH_4$ and $N_2O$ and flow rates thereof are set to 24 sccm and 600 sccm, respectively, and the chamber pressure is set to 150 Pa. Next, the deposited $SiO_2$ thin film is processed by photolithography and dry etching, to thereby form the second gate insulating layer 7. In this case, the first gate insulating layer 3 is simultaneously etched, to thereby expose the first gate electrode 2 (FIG. 4E).

Next, on the second gate insulating layer 7, an Mo thin film is formed at a thickness of 200 nm. The film formation conditions are the same as those in the formation of the first gate electrode. Then, the deposited Mo thin film is processed by photolithography and dry etching, to thereby form the second gate electrode 8 (FIG. 4F).

Next, on the second gate electrode 8, an $SiO_2$ thin film is formed at a thickness of 200 nm by plasma CVD. With respect to the film formation conditions, the substrate temperature is set to 250° C., the input RF power is set to 360 W, the process gases are $SiH_4$ and $N_2O$ and flow rates thereof are set to 24 sccm and 600 sccm, respectively, and the chamber pressure is set to 150 Pa. Next, the deposited $SiO_2$ thin film is processed by photolithography and dry etching, to thereby form a protective layer 15 (FIG. 4G).

Next, the element is irradiated with ultraviolet light from above, to thereby clean a surface of the transparent anode electrode 9. Next, an organic EL layer is formed on the exposed transparent anode electrode 9. The organic EL layer is formed by laminating the hole injecting layer 10, the organic light emitting layer 11, and the electron injecting layer 12 in the stated order. On the organic EL layer formed as described above, the cathode electrode 13 is formed. Finally, the glass sealing layer 14 is formed to seal the element (FIG. 4H).

As described above, the thin film transistor 100, which is formed in the display element produced without increasing the number of production steps, has a high light-shielding ability against ultraviolet light irradiated during the steps, stray light from the organic EL element, and outside light.

Evaluation methods and results of the drive ability and the light-shielding ability in this embodiment were the same as those in the first embodiment. It is conceived that influences of the stray light from the organic EL element and the outside light on the thin film transistor are small compared to that of UV light used in the experiment. Therefore, if the light-shielding ability against the UV light irradiation is sufficient, it is determined that the light-shielding ability against the stray light from the organic EL element or the outside light is also sufficient. Further, in order to drive the organic EL element, it is necessary to suppress both the shift in rising voltage and the increase in OFF current, which may occur due to UV light irradiation, to a value equal to or smaller than a certain threshold value. The experiment result in this embodiment satisfies the above-mentioned requirement.

(Third Embodiment)

Figure 8A:
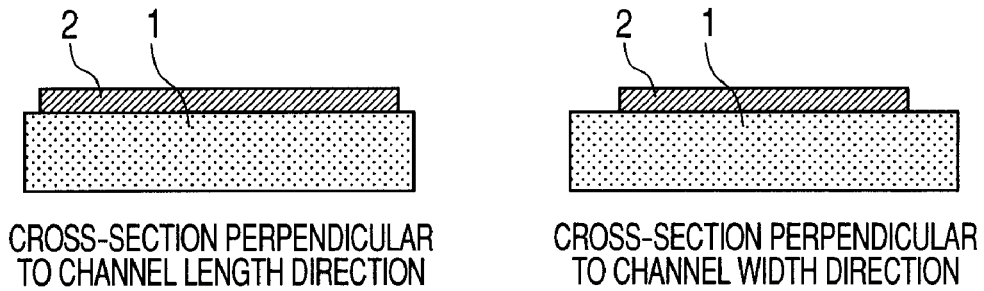
FIGS. 8A, 8B, 8C, 8D, 8E and 8F are cross-sectional views illustrating production steps of a thin film transistor according to a third embodiment of the present invention.
Figure 8B:
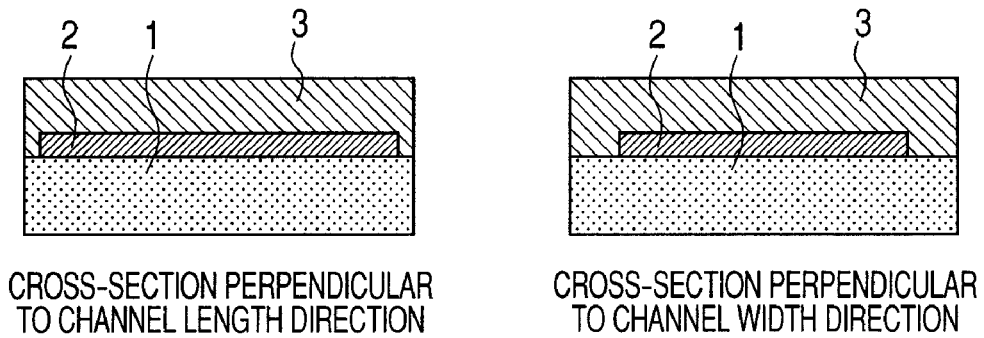
Figure 8C:
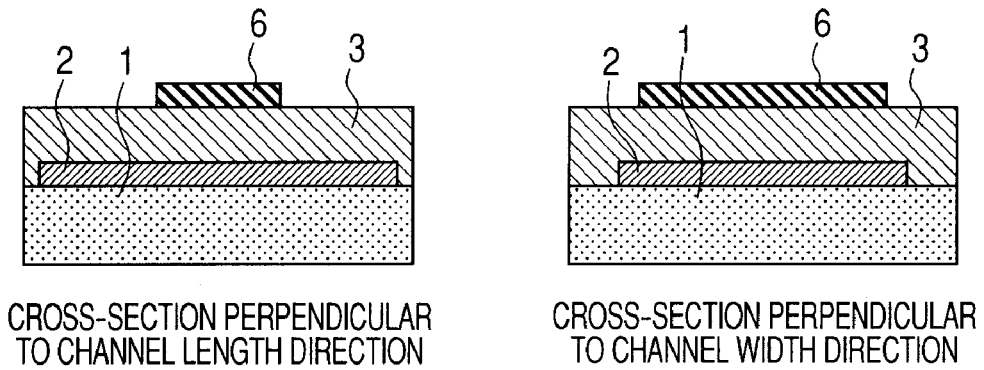
Figure 8D:
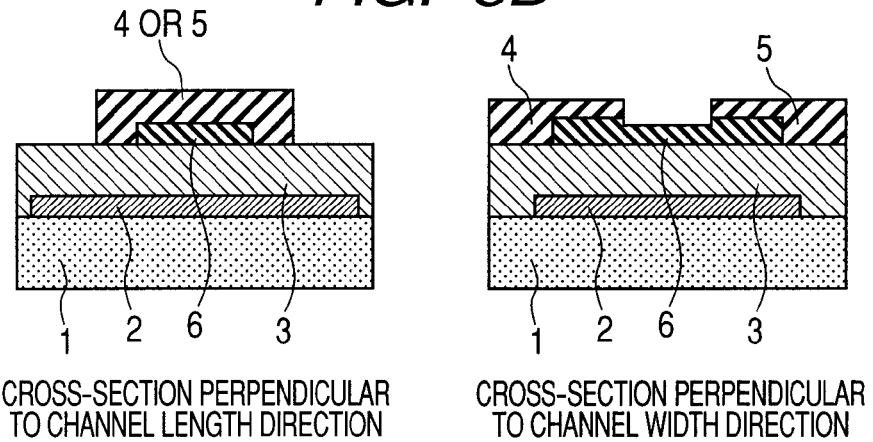
Figure 8E:
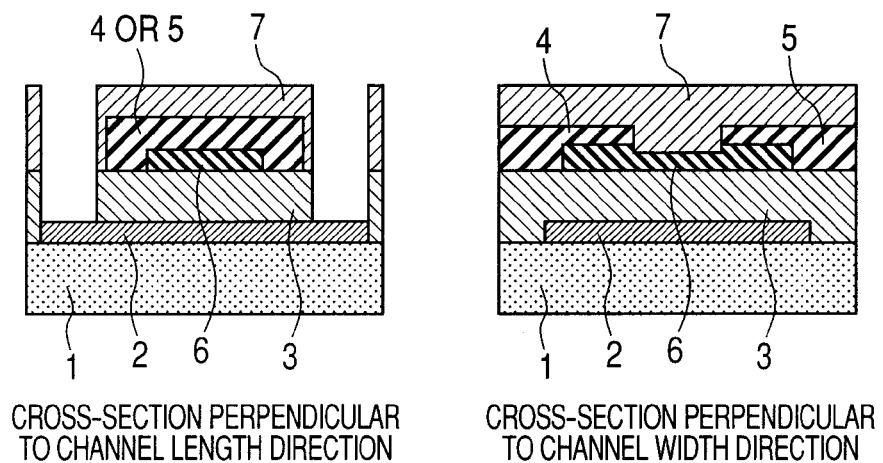
Figure 8F:
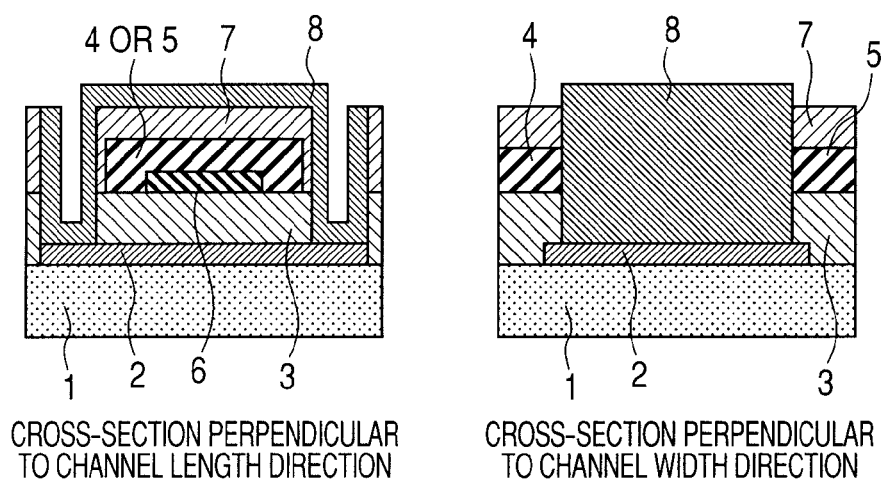

FIG. 8F is a cross-sectional view illustrating a structure of a thin film transistor according to a third embodiment of the present invention. In FIG. 8F, a cross-section perpendicular to a channel length direction of the thin film transistor (left) and a cross-section perpendicular to a channel width direction of the thin film transistor (right) are illustrated. As illustrated in FIG. 8F, this embodiment uses a channel-etch type thin film transistor as an example. Note that, in this embodiment, a case where the side-wall light-shielding layer is formed on both the sides of the semiconductor layer is described. However, by similar steps, the side-wall light-shielding layer may be formed only on one side of the semiconductor layer. The thin film transistor illustrated in FIGS. 8A to 8F is formed on the substrate 1. More specifically, the first gate electrode 2, the first gate insulating layer 3, the semiconductor layer 6, the source electrode 4, the drain electrode 5, the second gate insulating layer 7, and the second gate electrode 8 are formed on the substrate 1.

A glass substrate (Corning 1737) is used as the substrate 1. A thickness of the glass substrate is 0.5 mm. First, the first gate electrode 2 is formed on the substrate 1 (FIG. 8A). The film formation conditions of the first gate electrode 2 are the same as those in the first embodiment.

Next, the first gate insulating layer 3 is formed on the first gate electrode 2 (FIG. 8B). The film formation conditions of the first gate insulating layer 3 are the same as those in the first embodiment.

Next, the semiconductor layer 6 is formed on the first gate insulating layer 3 (FIG. 8C). The film formation conditions of the semiconductor layer 6 are the same as those in the first embodiment.

Next, on the first gate insulating layer 3 and the semiconductor layer 6, an Mo thin film is formed at a thickness of 100 nm by DC magnetron sputtering. With respect to the film formation conditions, the substrate temperature is set to the room temperature, the input RF power is set to 400 W, the supply flow rate of the argon gas is set to 100 sccm, and the chamber pressure is set to 0.5 Pa. Next, the deposited Mo thin film is processed by photolithography and dry etching, to thereby form the source electrode 4 and the drain electrode 5 (FIG. 8D). In this case, the semiconductor layer 6 is etched 5 nm by dry etching.

Next, the second gate insulating layer 7 is formed on the semiconductor layer 6, the source electrode 4, and the drain electrode 5. In this case, the first gate insulating layer 3 is simultaneously etched, to thereby expose the first gate electrode 2 (FIG. 8E). The film formation conditions of the second gate insulating layer 7 are the same as those in the first embodiment.

Next, the second gate electrode 8 is formed on the second gate insulating layer 7 (FIG. 8F). The film formation conditions of the second gate electrode 8 are the same as those in the first embodiment.

The thin film transistor produced as described above has characteristics of both high light-shielding ability and high drive ability.

The drive ability is evaluated in terms of the transfer characteristics. The ON current in the double-gate thin film transistor was about 2.5 times as that in the bottom-gate (one-side gate) driven thin film transistor formed of a similar element structure.

The light-shielding ability was evaluated by measuring the transfer characteristics before and after the thin film transistor was irradiated with UV light. Changes that may occur by irradiating the thin film transistor with UV light are a shift in rising voltage and an increase in OFF current. In the thin film transistor of this embodiment, the shift in rising voltage was less than 1 V, and the OFF current was less than $10^{-10}$ A.

(Fourth Embodiment)

In this embodiment, an example of performing heat treatment to the channel-etch type thin film transistor is described. The thin film transistor is produced by the same steps of the third embodiment. After the production of the thin film transistor is completed, heat treatment is performed for one hour at each temperature of 200° C., 250° C., and 300° C. by a hot plate. As illustrated in FIG. 7, by performing heat treatment at a temperature equal to or larger than 200° C., decrease in S value is confirmed. This is because process-induced damages on the upper layer of the semiconductor layer are recovered by the heat treatment. Note that, the light-shielding ability and the drive ability do not significantly change whether or not the heat treatment is performed. In this embodiment, a case where heat treatment is performed after the production of the thin film transistor is completed is described. However, it is confirmed that similar effects may be obtained even if heat treatment is performed at any stages, as long as the heat treatment is performed after the insulating film is deposited on the semiconductor layer.

(Fifth Embodiment)

In this embodiment, a case where wet etching treatment is performed to the channel-etch type thin film transistor after the source electrode and the drain electrode are formed is described by way of example. The thin film transistor is produced by the same steps of the third embodiment, except the wet etching treatment. The wet etching treatment is performed by using the hydrochloric acid, which is used to perform wet etching to the semiconductor layer in the first embodiment but 4-fold diluted in this embodiment, as an etchant. The thickness of the semiconductor layer after subjected to the wet etching is 10 nm. As illustrated in FIG. 7, by performing the wet etching, even if the heat treatment is not performed, the S value is much reduced compared with the case where wet etching is not performed. This is because the upper layer of the semiconductor layer having process-induced damage is removed by the wet etching. Note that, the light-shielding ability and the drive ability do not significantly change whether or not the wet etching treatment is performed. Further, as illustrated in FIG. 7, after the production of the thin film transistor is completed, when the heat treatment at a temperature equal to or larger than 200° C. is performed to the specimen subjected to the wet etching treatment, the S value is further reduced. Therefore, it is effective to perform the heat treatment described in the fourth embodiment in addition to the wet etching treatment.

(Sixth Embodiment)

Figure 9A:
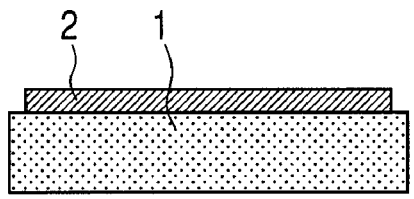
FIGS. 9A, 9B, 9C, 9D, 9E and 9F are cross-sectional views illustrating production steps of a thin film transistor according to a sixth embodiment of the present invention.
Figure 9A:
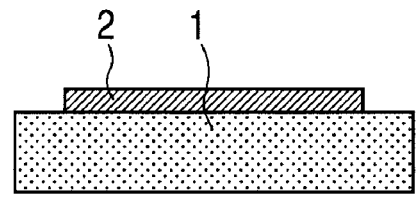
Figure 9B:
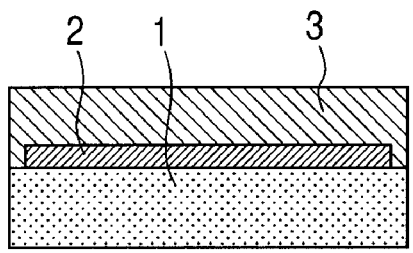
Figure 9B:
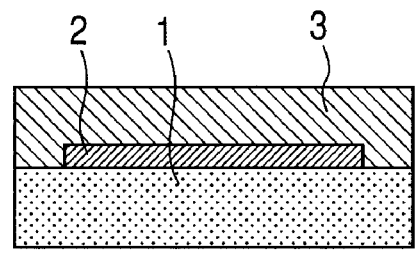
Figure 9C:
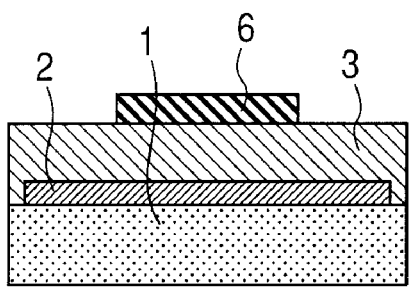
Figure 9C:
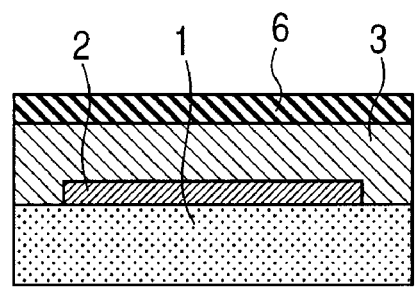
Figure 9D:
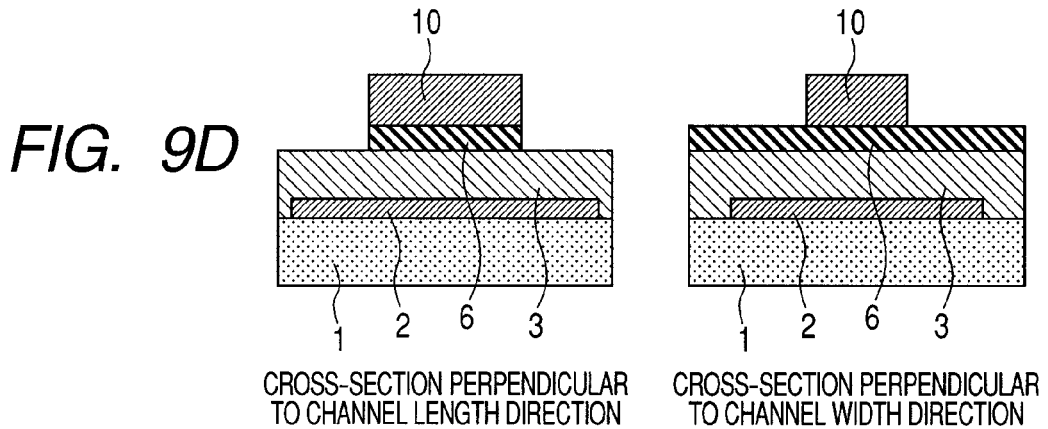
Figure 9E:
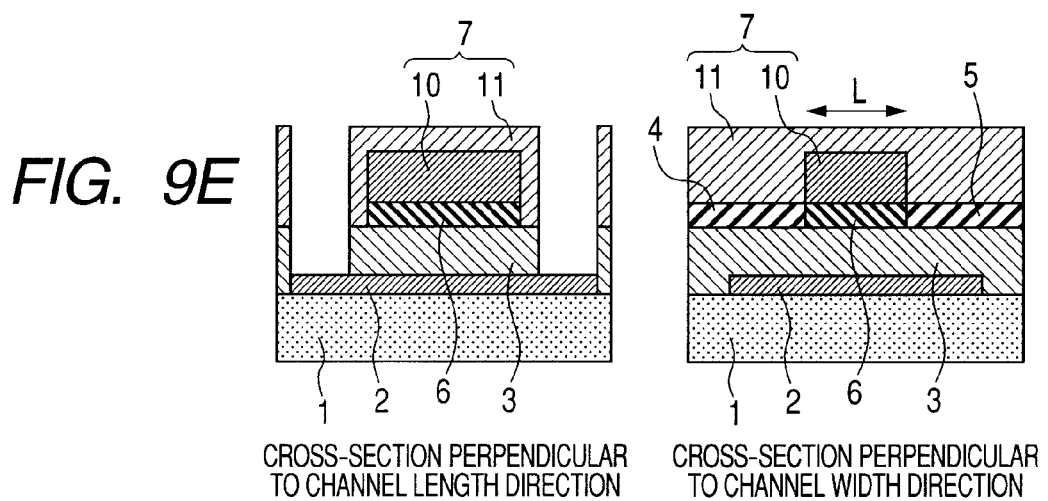
Figure 9F:
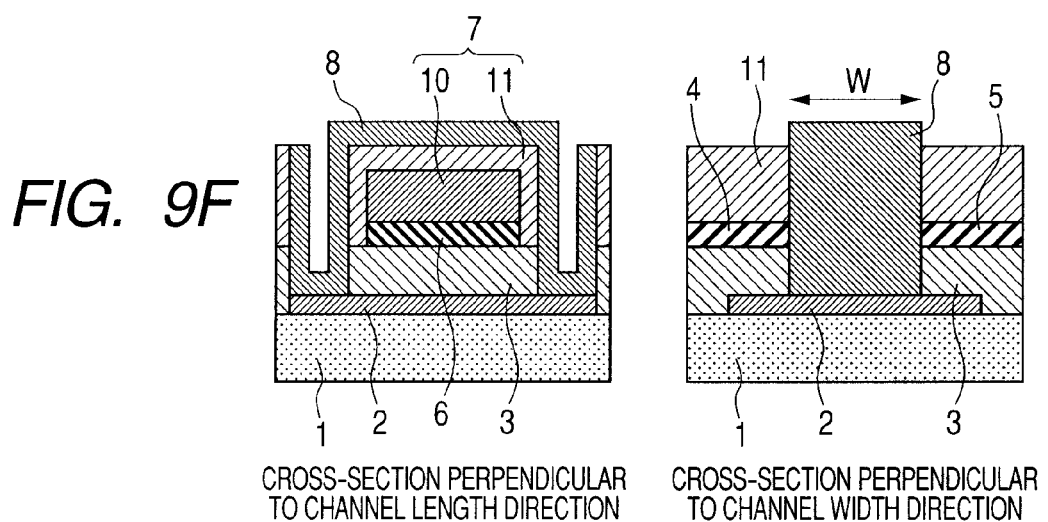

FIG. 9F is a cross-sectional view illustrating a structure of a thin film transistor according to a sixth embodiment of the present invention. In FIG. 9F, a cross-section perpendicular to the channel length direction of the thin film transistor (left) and a cross-section perpendicular to the channel width direction of the thin film transistor (right) are illustrated. As illustrated in FIG. 9F, this embodiment uses a coplanar type thin film transistor as an example. Note that, in this embodiment, a case where the side-wall light-shielding layer is formed on both the sides of the semiconductor layer is described. However, by similar steps, the side-wall light-shielding layer may be formed only on one side of the semiconductor layer. The thin film transistor illustrated in FIGS. 9A to 9F is formed on the substrate 1. More specifically, the first gate electrode 2, the first gate insulating layer 3, the semiconductor layer 6, the source electrode 4, the drain electrode 5, a stopper layer 10, a protective layer 11, the second gate insulating layer 7, and the second gate electrode 8 are formed on the substrate 1.

A glass substrate (Corning 1737) is used as the substrate 1. A thickness of the glass substrate is 0.5 mm.

First, the first gate electrode 2 is formed on the substrate 1 (FIG. 9A). The film formation conditions of the first gate electrode 2 are the same as those in the first embodiment.

Next, the first gate insulating layer 3 is formed on the first gate electrode 2 (FIG. 9B). The film formation conditions of the first gate insulating layer 3 are the same as those in the first embodiment.

Next, the semiconductor layer 6 is formed on the first gate insulating layer 3 (FIG. 9C). The film formation conditions of the semiconductor layer 6 are the same as those in the first embodiment.

Next, on the semiconductor layer 6, an $SiO_2$ thin film is formed at a thickness of 300 nm by plasma CVD. With respect to the film formation conditions, the substrate temperature is set to 250° C., the input RF power is set to 360 W, the process gases are SiH$_4$ and N$_2$O and flow rates thereof are set to 16 sccm and 400 sccm, respectively, and the chamber pressure is set to 150 Pa. Next, the deposited SiO$_2$ thin film is processed by photolithography and dry etching, to thereby form the stopper layer 10 (FIG. 9D).

Next, on the stopper layer 10 and the semiconductor layer 6, an SiON thin film is formed at a thickness of 300 nm by plasma CVD. A substrate temperature during the formation of the SiON thin film by plasma CVD is set to 250° C. SiH$_4$, NH$_3$, and N$_2$O are used as the process gases. The gas flow rate ratio is set to SiH$_4$:NH$_3$:N$_2$O=2:3:50. The input RF power density and the pressure are 0.9 W/cm$^2$ and 150 Pa, respectively. In this case, the resistance of regions of the semiconductor layer 6 which are in contact with the SiON thin film is greatly lowered under the influence of a film forming atmosphere of the SiON thin film and hydrogen contained in the thin film. Such regions of the semiconductor layer 6 having the lowered resistance are used as the drain electrode 5 and the source electrode 4 (FIG. 9E).

Next, the SiON thin film is patterned by photolithography and wet etching, to thereby form the protective layer 11. In this case, the first gate insulating layer 3 is simultaneously etched, to thereby expose the first gate electrode 2 (FIG. 9E).

Next, an Mo thin film is formed on the protective layer 11 at a thickness of 100 nm. The film formation conditions are the same as those in the formation of the first gate electrode. Then, the deposited Mo thin film is finely processed by photolithography and wet etching, to thereby form the second gate electrode 8 (FIG. 9F). At this time, the stopper layer 10 and the protective layer 11 sandwiched between the second gate electrode 8 and the semiconductor layer 6 serve as the second gate insulating layer 7.

As illustrated in the view on the right side of FIG. 9F, in a region where the second gate electrode 8 penetrates the first gate insulating layer 3 and the second gate insulating layer 7 to be electrically connected to the first gate electrode 2, a width W of an orthogonal projection in a direction of a channel length of the thin film transistor is larger than a channel length L (view on the right side of FIG. 9E) of the thin film transistor.

The thin film transistor produced as described above has characteristics of both high light-shielding ability and high drive ability.

The drive ability was evaluated in terms of the transfer characteristics. The ON current in the double-gate thin film transistor was about 2.5 times as that in the bottom-gate (one-side gate) driven thin film transistor formed of a similar element structure.

The light-shielding ability was evaluated by measuring the transfer characteristics before and after the thin film transistor was irradiated with UV light. Changes that may occur by irradiating the thin film transistor with UV light are a shift in rising voltage and an increase in OFF current. In the thin film transistor of this embodiment, the shift in rising voltage was less than 1 V, and the OFF current was less than $10^{-10}$ A.

(Seventh Embodiment)

Figure 10E:
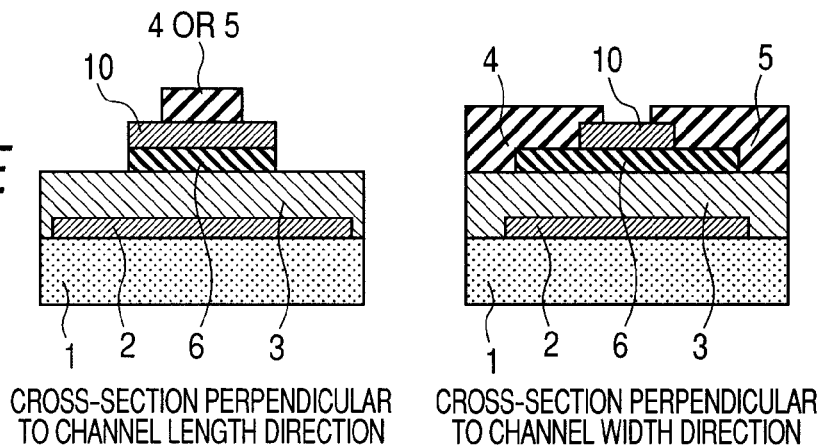
Figure 10F:
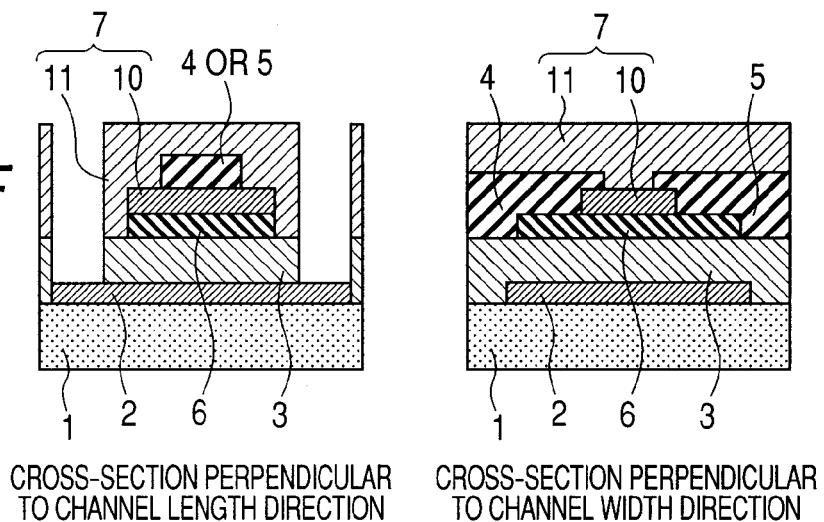
Figure 10G:
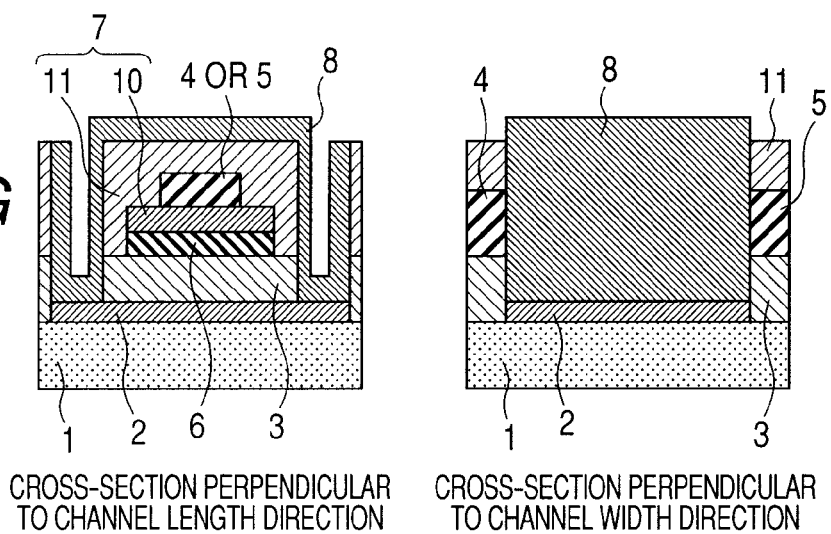

FIG. 10G is a cross-sectional view illustrating a structure of a thin film transistor according to a seventh embodiment of the present invention. In FIG. 10G, a cross-section perpendicular to the channel length direction of the thin film transistor (left) and a cross-section perpendicular to the channel width direction of the thin film transistor (right) are illustrated. As illustrated in FIG. 10G, this embodiment uses a channel-protection type thin film transistor as an example. Note that, in this embodiment, a case where the side-wall light-shielding layer is formed on both the sides of the semiconductor layer is described. However, by similar steps, the side-wall light-shielding layer may be formed only on one side of the semiconductor layer. The thin film transistor illustrated in FIGS. 10A to 10G is formed on the substrate 1. More specifically, the first gate electrode 2, the first gate insulating layer 3, the semiconductor layer 6, the source electrode 4, the drain electrode 5, the stopper layer 10, the protective layer 11, the second gate insulating layer 7, and the second gate electrode 8 are formed on the substrate 1.

A glass substrate (Corning 1737) is used as the substrate 1. A thickness of the glass substrate is 0.5 mm.

First, the first gate electrode 2 is formed on the substrate 1 (FIG. 10A). The film formation conditions of the first gate electrode 2 are the same as those in the first embodiment.

Next, the first gate insulating layer 3 is formed on the first gate electrode 2 (FIG. 10B). The film formation conditions of the first gate insulating layer 3 are the same as those in the first embodiment.

Next, the semiconductor layer 6 is formed on the first gate insulating layer 3 (FIG. 10C). The film formation conditions of the semiconductor layer 6 are the same as those in the first embodiment.

Next, the stopper layer 10 is formed on the semiconductor layer 6 (FIG. 10D). The film formation conditions of the stopper layer 10 are the same as those in the sixth embodiment.

Next, on the stopper layer 10 and the semiconductor layer 6, an Mo thin film is formed at a thickness of 100 nm. The film formation conditions are the same as those in the formation of the first gate electrode. Next, the deposited Mo thin film is finely processed by photolithography and dry etching, to thereby form the drain electrode 5 and the source electrode 4 (FIG. 10E).

Next, the protective layer 11 is formed on the stopper layer 10, the drain electrode 5, and the source electrode 4. The film formation conditions of the protective layer 11 are the same as those of the sixth embodiment. In this case, the first gate insulating layer 3 is simultaneously etched, to thereby expose the first gate electrode 2 (FIG. 10F).

Next, the second gate electrode 8 is formed on the protective layer 11 (FIG. 10G). At this time, the stopper layer 10 and the protective layer 11 sandwiched between the second gate electrode 8 and the semiconductor layer 6 serve as the second gate insulating layer 7.

The thin film transistor produced as described above has characteristics of both high light-shielding ability and high drive ability.

The drive ability was evaluated in terms of the transfer characteristics. The ON current in the double-gate thin film transistor was about 2.5 times as that in the bottom-gate (one-side gate) driven thin film transistor formed of a similar element structure.

The light-shielding ability was evaluated by measuring the transfer characteristics before and after the thin film transistor is irradiated with ultraviolet (UV) light. Changes that may occur by irradiating the thin film transistor with UV light are a shift in rising voltage and an increase in OFF current. In the thin film transistor of this embodiment, the shift in rising voltage was less than 1 V, and the OFF current was less than $10^{-10}$ A.

The present invention is applicable to a field effect transistor for driving a liquid crystal display or an organic EL display.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-194134, filed Aug. 25, 2009, and Japanese Patent Application No. 2010-134341, filed Jun. 11, 2010, which are hereby incorporated by references herein in their entireties.

What is claimed is:

1. A thin film transistor, comprising:
a first gate electrode;
a first gate insulating layer covering said first gate electrode;
a semiconductor layer disposed on said first gate insulating layer;
a second gate insulating layer disposed on said semiconductor layer;
a second gate electrode disposed on said second gate insulating layer; and
a drain electrode and a source electrode which are electrically connected to said semiconductor layer, wherein:
said semiconductor layer comprises an oxide semiconductor containing at least one of Zn, Ga, In, and Sn;
said first gate electrode shields light entering said semiconductor layer from below;
said second gate electrode shields light entering said semiconductor layer from above; and
said second gate electrode is electrically connected to said first gate electrode by penetrating through an opening in said first gate insulating layer and an opening in said second gate insulating layer.

2. The thin film transistor according to claim 1, wherein said semiconductor layer has a band gap which is equal to or larger than 3 eV.

3. The thin film transistor according to claim 1 or 2, wherein, in a region where said second gate electrode is electrically connected to said first gate electrode, said thin film transistor has a width of an orthogonal projection in a direction of a channel length larger than the channel length thereof.

4. The thin film transistor according to claim 1 or 2, wherein, when said drain electrode and said source electrode are in contact with an upper surface of said semiconductor layer and a thickness of said semiconductor layer overlapped with said drain electrode or said source electrode is d, a thickness of said semiconductor layer in a region serving as a channel is thinner than d in a range of equal to or larger than 1 nm and equal to or smaller than (d−10) nm.

5. A display device comprising the thin film transistor according to claim 1 or 2.

6. The display device according to claim 1,
wherein a first part of a conductive film functions as said second gate electrode and a second part of said conductive film is in said opening in said first gate insulating layer and said opening in said second gate insulating layer, and
wherein a second part of said conductive film shields light entering said semiconductor layer from at least one of plural sides of said semiconductor layer.

7. The display device according to claim 1, wherein said oxide semiconductor is an amorphous oxide semiconductor.

* * * * *